United States Patent [19]

Togawa et al.

[11] 4,144,501
[45] Mar. 13, 1979

[54] QUADRATURE FM DETECTOR INCLUDING LOW REACTANCE PHASE SHIFTER

[75] Inventors: Kazuya Togawa; Kimio Masaie, both of Hakui, Japan

[73] Assignee: Murata Manufacturing Co., Ltd., Nagaokakyo, Japan

[21] Appl. No.: 880,013

[22] Filed: Feb. 21, 1978

[30] Foreign Application Priority Data

Feb. 19, 1977 [JP] Japan .................................. 52/17404

[51] Int. Cl.² ............................................. H03D 3/16
[52] U.S. Cl. .................................... 329/118; 329/137; 329/198
[58] Field of Search ............... 329/117, 118, 137, 103, 329/119, 198; 325/349

[56] References Cited

U.S. PATENT DOCUMENTS

| | | | |
|---|---|---|---|
| 3,573,643 | 4/1971 | Livenick | 329/117 |
| 3,648,184 | 3/1972 | Fujishima et al. | 329/198 |

OTHER PUBLICATIONS

O'Neil, Jr., "FM Demodulator Using Three Pin Two-Pole Monolithic Crystal and CA 3089 Quadrature Detector", RCA Technical Notes, No. 1155, Jun. 8, 1976, pp. 1-2.

*Primary Examiner*—Siegfried H. Grimm
*Attorney, Agent, or Firm*—Wenderoth, Lind & Ponack

[57] ABSTRACT

An improved quadrature detector for producing a frequency demodulated signal employing a low reactance phase shifter. A quadrature FM detector demodulates a frequency modulated signal by phase comparison of a signal directly from the limiter with a signal coupled through a multi-mode resonator tank circuit and a 90° phase shift circuit. In the prior art the 90° phase shift circuit includes a series coupled capacitor having a high reactance which tends to attenuate the signal and decrease the low distortion bandwidth. Accordingly in the present invention a coil is connected across the input or output terminals of the multi-mode tank circuit thereby enabling the phase shift circuit to employ a low reactance capacitor yielding an improved signal level and low distortion bandwidth.

7 Claims, 6 Drawing Figures

QUADRATURE FM DETECTOR INCLUDING LOW REACTANCE PHASE SHIFTER

The present invention relates to a detector for use in an FM receiver and, more particularly, to a detector of the type which detects waveforms in quadrature, referred to as a quadrature detector.

The principle of the quadrature detector is shown in FIG. 1 in which a limiter 1 provided at the final stage of the FM intermediate frequency amplifier has an output terminal connected to a first input terminal of a phase comparator 2 on one hand and to a second input terminal of the phase comparator 2 through a tank circuit 3 and a phase shifter 4 on the other hand. The signal applied to the second input terminal of the phase comparator 2 has been shifted approximately 90° in phase in the phase shifter 4 relative to the center frequency of the FM intermediate frequency. The phase comparator 2 compares the two signals, applied to the first and second input terminals thereof, with each other and then generates an output signal in the form of a train of pulses. The duration of each of the pulses of the train varies depending on the magnitude of change in phase difference between the signals applied to the comparator 2. This train of pulses emerging from the comparator 2 is fed to an integrator (not shown) and, then, averaged in the next stage to produce a frequency demodulated signal.

The conventional tank circuit 3 includes, as shown in FIG. 2, a multi-mode resonator 5 of the trapped energy type capable of producing a vibrational mode including two or more of various modes, such as, thickness shear, thickness twist and thickness expansion modes. The resonator 5, made of a ceramic material, is laminated on one surface thereof with an input electrode 5a and an output electrode 5b while a common electrode 5c is laminated on the other surface thereof. The input electrode 5a is connected to a first input terminal 6a and the output electrode 5b is connected to a first output terminal 7a of the tank circuit 3 while the common electrode 5c is grounded on one hand and connected to a second input terminal 6b and also to a second output terminal 7b on the other hand. The tank circuit 3 further includes a resistor Ra connected between the output electrode 5b and the common electrode 5c.

The phase shifter 4 includes a capacitor Co connected between a first input terminal 9a and a first output terminal 10a of the phase shifter 4, respectively, and a resistor Rb connected between the first output terminal 10a and a second output terminal 10b. Input terminals 9a and 9b of the phase shifter 4 are connected to the respective output terminals 7a and 7b of the tank circuit 3. In other words, the tank circuit 3 and the phase shifter 4 are connected in the so-called cascade manner.

Although the quadrature detector of the above described construction employing the mutli-mode resonator 5 of the trapped energy type is quite simple in construction and can readily be used as a frequency modulation circuit without any adjustment required in the constructing components thereof, it is necessary to select a capacitor Co having a comparatively low capacitance, for example, of the order of a few pF to several ten's of pF, so as to achieve the phase shift of 90°. This low capacitance of the capacitor Co positioned between the first input terminal 9a and the first output terminal 10a of the phase shifter 4 results in a high reactance and, therefore, the signal transmitted through the capacitor Co is considerably attenuated. Accordingly, the signal produced across the resistor Rb, that is, the signal produced between the first and second output terminals 10a and 10b, is so low that the available signal in which the voltage level exceeds the gate threshold level of the comparator 2 is limited to a narrow bandwidth, while the signal itself is comparatively low. Furthermore, the bandwidth available having a low distortion ratio is limited to a comparatively narrow bandwidth.

Accordingly, a primary object of the present invention is to provide a quadrature detector of an improved type which can produce a high output signal for presenting a wide bandwidth of available signal.

Another object of the present invention is to provide a quadrature detector of the above described type which is simple in construction and can be readily manufactured at low cost.

In order to accomplish these and other objects of the present invention, the quadrature detector according to the present invention comprises a capacitor of a comparatively high capacitance incorporated in the phase shifter and an inductance element such as a coil connected in parallel to the resonator, for example, between the input electrode and the common electrode or between the output electrode and the common electrode, so as to reduce the reactance of the phase shifter. Therefore, the signal passing through the quadrature detector, particularly, through the capacitor will not be attenuated and, as a consequence, the signal emerging from the output of the quadrature detector is high enough to yield a wide frequency region or bandwidth having a voltage level of the output signal which exceeds the gate threshold level of the comparator 2. Furthermore, the frequency region having a low distortion ratio is wider in range.

These and other objects and features of the present invention will become apparent from the following description taken in conjunction with preferred embodiments thereof with reference to the accompanying drawings, in which.

Before the description of the present invention proceeds, it is to be noted that like parts are designated by like reference numerals throughout the accompanying drawings.

Figure 3:
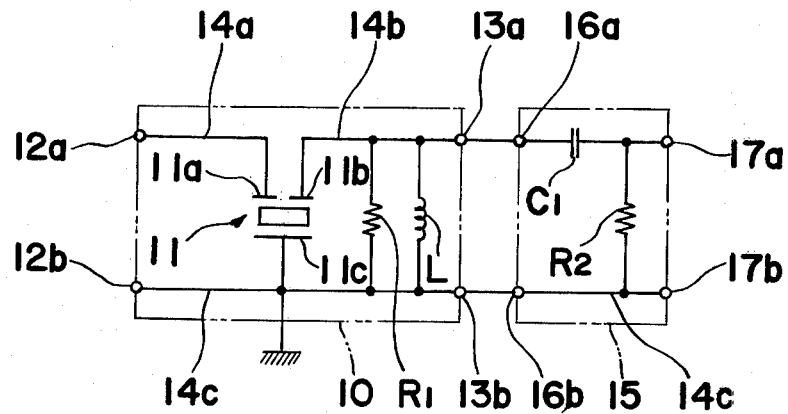
FIG. 3 is a diagram similar to FIG. 2, showing an improved quadrature detector according to a preferred embodiment of the present invention.

Referring to FIG. 3, a quadrature detector according to the present invention includes a tank circuit 10 and a phase shifter 15. The tank circuit 10 comprises a multi-mode resonator 11 of the trapped energy type capable of producing a vibrational mode including two or more of various modes, such as, thickness shear, thickness twist and thickness expansion modes. The resonator 11, made of piezoelectric ceramic material, is laminated on one surface thereof with an input electrode 11a and an output electrode 11b while a common electrode 11c is laminated on the other surface thereof. The common electrode 11c may be divided into a plurality of, such as two, sections as described in British Pat. No. 1,187,472. The input electrode 11a is connected to a first input terminal 12a of the tank circuit 10 via a lead line 14a and the output electrode 11b is connected to a first output terminal 13a of the tank circuit 10 via a lead line 14b, while the common electrode 11c is grounded on the one hand and connected to a second input terminal 12b and a second output terminal 13b through a lead line 14c on the other hand. The tank circuit 10 further comprises a resistor $R_1$ and a coil L which are connected in parallel with each other between the lead lines 14b and 14c.

The phase shifter 15 has first and second input terminals 16a and 16b and first and second output terminals 17a and 17b phase shifter 15 is cascade-connected to the tank circuit 10 with the output terminals 13a and 13b of tank circuit 10 connected to the input terminals 16a and 16b of phase shifter 15, respectively. The phase shifter 15 comprises a capacitor $C_1$ connected between the first input terminal 16a and the first output terminal 17a and a resistor $R_2$ connected between the first and second output terminals 17a and 17b.

Figure 1:
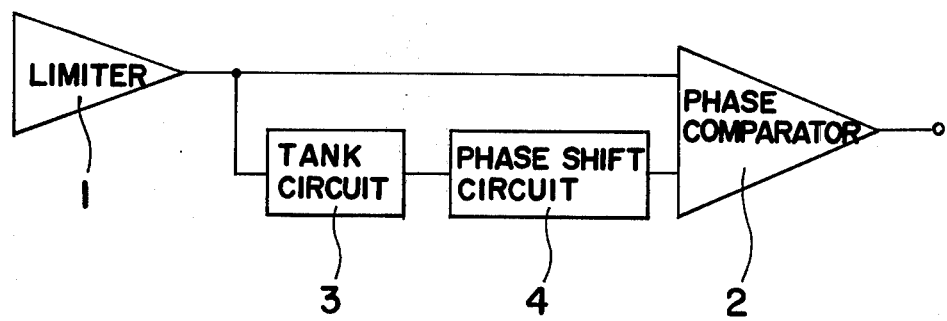
FIG. 1 is a block diagram showing a principle form of a quadrature detector.
Figure 2:
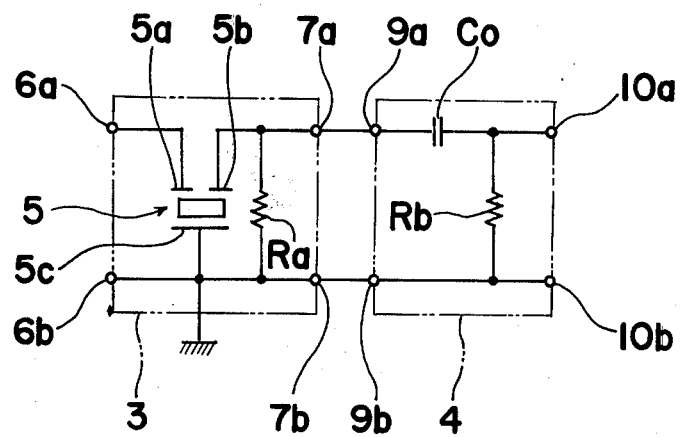
FIG. 2 is a circuit diagram showing the details of a portion of the prior art quadrature detector, that portion including a tank circuit and a phase shifter.

It is to be noted that capacitor $C_1$ employed in the phase shifter 15 has a higher capacitance than that of the capacitor Co employed in the conventional phase shifter described above with reference to FIG. 2.

Since the quadrature detector of the present invention has coil L in the tank circuit 10, the total reactance of the quadrature detector established by the coil L and the capacitor $C_1$ is substantially equal to the total reactance of the conventional quadrature detector and the total reactance is low enough to make the phase shift angle of the FM signal passing therethrough approximately 90°. Accordingly, the reactance of the capacitor $C_1$ is lower than the reactance of the capacitor Co, so that the signal attenuation caused by the capacitor C 1 is much smaller than that caused by the capacitor Co. The output signal produced from the output terminals 17a and 17b of the phase shift circuit 15 is so large that the available signal exceeds the gate threshold level of the comparator 2 over a wide frequency region. Furthermore, the frequency region available with a low distortion ratio is widened.

Figure 4:
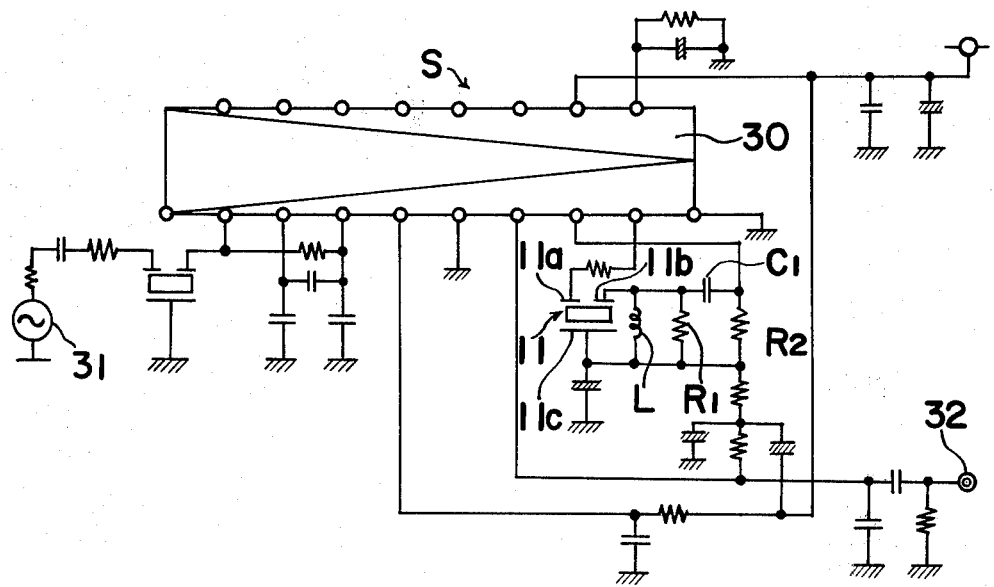
FIG. 4 is a circuit diagram in which the quadrature detector shown in FIG. 3 is connected to a source of FM signal for detecting the output amplitude and distortion characteristics of the quadrature detector of the present invention.

Referring to FIG. 4, there is shown a circuit S in which the tank circuit 10 and the phase shift circuit 15 are coupled to an integrator circuit 30 designed to be coupled in the quadrature detector of the present invention. The integrator circuit 30 has a number of input and output terminals, one of those output terminals, from which the FM intermediate frequency fo of 10.7 MHz is generated, is connected to the input terminal 11a of the resonator 11 while one of those input terminals is connected to a signal generator or oscillator 31. The signal generated from the quadrature detector is obtained from an output terminal 32 which is in turn fed to a voltage meter and a distortion meter (both not shown) to detect output amplitude characteristic and distortion characteristic thereof. According to one of tests conducted by the present inventors, the capacitance of the capacitor $C_1$ is 120 pF and the inductance of the coil L is 3.3 μH.

Figure 5:
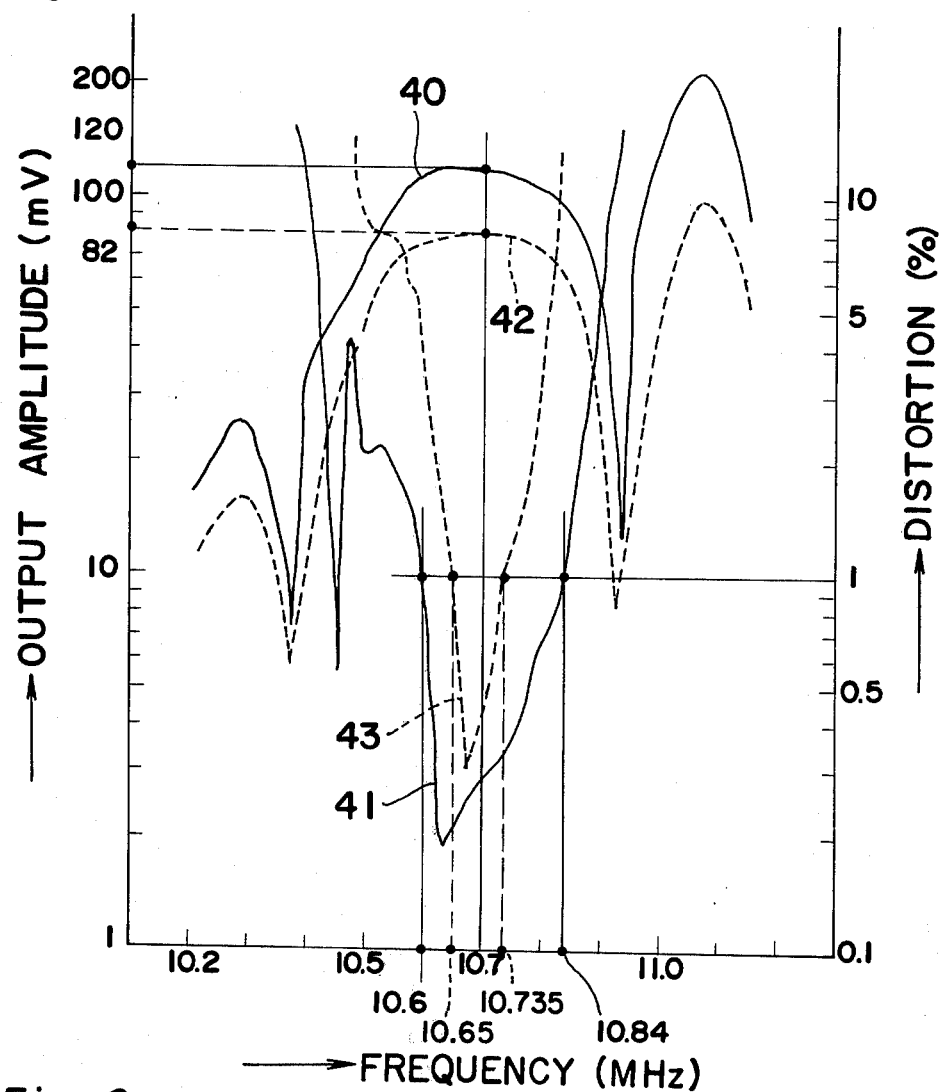
FIG. 5 is a graph showing the output amplitude and distortion characteristics of the quadrature detector of the present invention together with those of the conventional quadrature detector for the purpose of comparison.

In this arrangement as described above, the output amplitude characteristic obtained and distortion characteristic are shown by the graph of FIG. 5 wherein the abscissa represents the frequency of the FM signal and the ordinate represents the amplitude of the detected signal and the degree of distortion in percentage. In the graph of FIG. 5, the curves 40 and 41 shown in solid lines show the output amplitude characteristic and distortion characteristic, respectively, of the quadrature detector of the present invention and, for the comparison, the curves 42 and 43 shown in broken lines show the output amplitude characteristic and distortion characteristic, respectively, of the quadrature detector of the construction shown in FIG. 2 with the capacitance of the capacitor Co being 6.8 pF.

As can be understood from the graph of FIG. 5, the quadrature detector of the present invention can yield an output signal having an amplitude of 120mV when operated at the intermediate frequency of 10.7 MHz. In contrast, the conventional quadrature detector yields an output signal having an amplitude of 82mV, when operated at the same intermediate frequency, which is clearly lower than the amplitude given by the present invention.

Moreover, according to the quadrature detector of the present invention, the frequency region available with a low distortion ratio of below 1% is obtained between 10.6 MHz and 10.84 MHz, the frequency bandwidth being 240 KHz. On the contrary, according to the quadrature detector of the conventional type, the frequency region available with a low distortion ratio of below 1% is limited to between 10.65 MHz and 10.753 MHz, the frequency bandwidth being 85 KHz.

From the foregoing, it is clear that the quadrature detector of the present invention is improved in output amplitude characteristic in such a way that the output amplitude is increased approximately 40mV, and in distortion characteristic in such a way that the frequency bandwidth with a low distortion ratio is widened approximately 155 KHz.

Figure 6:
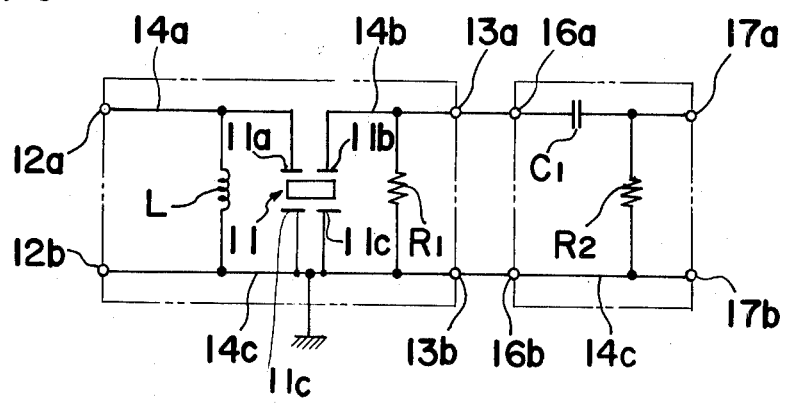
FIG. 6 is a view similar to FIG. 3, showing a modification thereof.

Referring to FIG. 6, there is shown a modified form of the quadrature detector. In the quadrature detector shown in FIG. 6, the coil L, which has been described as connected between the lead lines 14b and 14c in the foregoing embodiment of FIG. 3, is connected between the lead lines 14a and 14c for compensating the reactance of the capacitor $C_1$ in a substantially similar manner as hereinbefore described.

As can be understood from the foregoing description, the signal passing through the tank circuit 10 and the phase shift circuit 15 of the quadrature detector of the present invention is not so much attenuated as the signals passing through the conventional type quadrature detector, since the capacitor provided for phase shifting can be arranged to have a low reactance by the presentation of the inductance element provided between the input electrode 11a and the common electrode 11c of the resonator 11 or between the output electrode 11b and the common electrode 11c of the resonator 11. Furthermore, since the signal to be supplied to the input of the quadrature detector, such as those emerging from the limiter 1, normally has a comparatively high amplitude, which is large enough to exceed the threshold level of the phase comparator 2, it is possible to obtain a frequency demodulated signal which has a high output level with less noise, while the frequency range in which low distortion is present is widened.

Although the present invention has fully been described by way of examples with reference to the accompanying drawings, it is to be noted that various changes and modifications are apparent to those skilled in the art. Therefore, unless such changes and modifications depart from the true scope of the present invention, they should be construed as included therein.

What is claimed is:

1. A quadrature detector for producing a frequency demodulated signal by the detection of a phase difference between a signal, applied thereto from a limiter, and a signal applied thereto from the limiter through a tank circuit and a phase shift circuit for shifting the second mentioned signal approximatedly 90° in phase, said quadrature detector comprising in combination:

a multi-mode resonator of trapped energy type included in said tank circuit, said resonator having input and output electrodes laminated on one surface thereof and common electrode element laminated on the other surface thereof;

a capacitor included in said phase shift circuit, said capacitor connected between output and input terminals of the phase shift circuit;

a resistor included in said phase shift circuit, said resistor connected between two output terminals of the phase shift circuit; and an inductance element coupled to said resonator for facilitating the use of said capacitor having a comparatively high capacitance necessary to prevent said second mentioned signal from being considerably attenuated during its passage through such said capacitor, thereby allowing the phase shift circuit to generate an output signal of high level.

2. A quadrature detector as claimed in claim 1, wherein said inductance element is constituted by a coil.

3. A quadrature detector as claimed in claim 1, wherein said inductance element is connected between said input electrode and common electrode element of the resonator.

4. A quadrature detector as claimed in claim 1, wherein said inductance element is connected between said output electrode and common electrode element of the resonator.

5. A quadrature detector as claimed in claim 1, wherein said common electrode element is constituted by a layer of electrically conductive material.

6. A quadrature detector as claimed in claim 5, wherein said layer is a solid layer extended on the other surface of said resonator.

7. A quadrature detector as claimed in claim 5, wherein said layer is divided into two sections.

* * * * *